United States Patent [19]

Madan

[11] Patent Number: 4,994,873
[45] Date of Patent: Feb. 19, 1991

[54] LOCAL INTERCONNECT FOR STACKED POLYSILICON DEVICE

[75] Inventor: Sudhir K. Madan, Dallas, Tex.
[73] Assignee: Motorola, Inc., Schaumburg, Ill.
[21] Appl. No.: 456,712
[22] Filed: Dec. 26, 1989

Related U.S. Application Data

[63] Continuation-in-part of Ser. No. 258,545, Oct. 17, 1988.
[51] Int. Cl.[5] ............... H01L 29/10; H01L 29/68
[52] U.S. Cl. ..................... 357/23.5; 357/23.6; 357/23.4
[58] Field of Search ................. 357/23.5, 23.7

[56] References Cited

U.S. PATENT DOCUMENTS 4,698,659 10/1987 Mizutani ................. 357/23.7

Primary Examiner—Rolf Hille
Assistant Examiner—Wael Fahmy
Attorney, Agent, or Firm—James L. Clingan, Jr.

[57] ABSTRACT

A semiconductor device is formed in an active region of a substrate. The device has first and second polysilicon strips which are aligned. The first polysilicon strip is somewhat wider than the second. A contact is formed between the second polysilicon strip and a region in the active region. The contact is ensured of not shorting to the first polysilicon strip by the use of an extra sidewall spacer. One sidewall is already present but is etched down to expose the second polysilicon strip. The etching down of the one sidewall spacer may also expose a corner of the first polysilicon strip. The extra sidewall spacer covers the potentially exposed corner. The first polysilicon strip can also have a neck portion protruding toward the second polysilicon strip and aligned with the second polysilicon strip. This further improves the margin by which the contact will avoid the corner of the first polysilicon strip.

3 Claims, 13 Drawing Sheets

LOCAL INTERCONNECT FOR STACKED POLYSILICON DEVICE

RELATED APPLICATION

This application is a continuation-in-part of patent application Ser. No. 258,545 Sudhir K. Madan, entitled "Method For Making A Polysilicon Transistor," filed Oct. 17, 1988.

FIELD OF THE INVENTION

The invention relates to methods for making MOS transistors devices, and more particularly, to making contact between a second conductive layer and a doped region in a semiconductor substrate.

BACKGROUND OF THE INVENTION

The advantage of polysilicon transistors for use in a CMOS static random access memory (SRAM) cells has been known for quite some time. This type of cell generally has four N channel transistors formed in the substrate with two P channel transistors formed in the second layer of polysilicon. The two P channel transistors act as loads in place of the commonly-used resistor loads. The P channel transistors reduce power consumption while also improving cell stability. These advantages can also be obtained with P channel loads formed in the substrate but there is then a significant increase in the amount of space required for the cell. Having the P channel load in the second layer of polysilicon results in a cell which is nearly the same size as a cell which uses resistor loads. Even with these strong advantages, the difficulties in actually manufacturing such P channel load SRAM cells has resulted in the cell which uses resistor loads being the cell which is by far the most commonly manufactured.

One of the problems that is inherent in the P channel load cell is that N-type regions must be connected to P-type regions without the formation of a blocking PN junction. One solution to this problem was taught in U.S. Pat. No. 4,581,623, Wang. Another problem is the integrity of the gate insulator between the first and second polysilicon layers. The gate of the polysilicon transistor is formed in the first layer of polysilicon. The source, drain, and channel are formed in the second layer of polysilicon. The gate insulator is thus the interlayer insulator between the first and second polysilicon layers. The gate insulator needs to be thin enough so that the voltage on the gate can provide enough influence on the channel to provide the desired effect. The thinner the gate insulator, however, the more critical that the insulating material be of high integrity throughout. This is achieved by growing oxide at a relatively high temperature. After the first layer of polysilicon is deposited but before the interlayer insulator is formed, the sources and drains are formed in the substrate. The interlayer insulator is then formed but the high temperature needed to form a high integrity gate will deleteriously cause excessive diffusion of the source and drain regions in the substrate which have already been formed, causing short channel effects. Thus, as a compromise, the interlayer insulator is made thicker but grown or deposited at lower temperature. Annealing of the first polysilicon layer, which requires an extra heat cycle, is also desirably done to enlarge grain size to improve the performance of the polysilicon transistor. Because the extra heat cycle also increases the diffusion of source and drain regions in the substrate, the annealing must also be compromised. The annealing done at a lower than optimum temperature results in a grain size which is smaller than could be obtained but for the temperature limitations. The thick interlayer insulator and small grain size result in a polysilicon transistor which has high leakage when it is supposed to be nonconductive and is highly resistive when it is supposed to be conductive. Thus, over processing variations, the performance of the P channel load transistors formed in the second layer of polysilicon varied so widely that the improvement over the resistive loads could not be trusted and the increased process complexity further reduced yields. Thus, the resistive load cell has remained the design of choice for commercially viable SRAM products.

Even in the resistive load cell approach there is the need for an effective local interconnect. There is probably not the problem of connecting a P-type region to an N-type region, but the connection between the drain of the transistor and the load is typically a connection between the second layer of polysilicon, which is where the load is formed, and a doped region in the substrate, which is where the drain of the transistor is formed. For efficient layout of the memory cell, the second polysilicon layer may be in close proximity to a portion of the first layer of polysilicon as well as the drain region to which connection is to be made. There is thus a problem of the local interconnect actually shorting to this portion of the first polysilicon in close proximity.

SUMMARY OF THE INVENTION

Accordingly, it is an object of the present invention to provide an improved method for making a local interconnect.

Another object of the invention is to provide an improved device structure for making a local interconnect.

In carrying out these and other objects of the invention, there is provided, in one form, a semiconductor device on an active region of a substrate. The semiconductor device has a first conductive strip, a second conductive strip, a first sidewall spacer, a second sidewall spacer, a region in the active region, and a contact. The first conductive strip is over and is insulated from the active region. The second conductive strip is over and is insulated from the first conductive strip. The first sidewall spacer is adjacent to a side of the first conductive strip. The first sidewall spacer has a side away from the conductive strip. The second sidewall spacer is on the side of the first sidewall spacer away from the first conductive strip. The region in the active region is adjacent to the second sidewall spacer. The contact is between the region in the active region and the second conductive strip.

BRIEF DESCRIPTION OF THE DRAWINGS

FIGS. 3A–3K are cross-sections of a device structure according to a preferred embodiment of the invention.

DETAILED DESCRIPTION OF THE INVENTION

Figure 1:
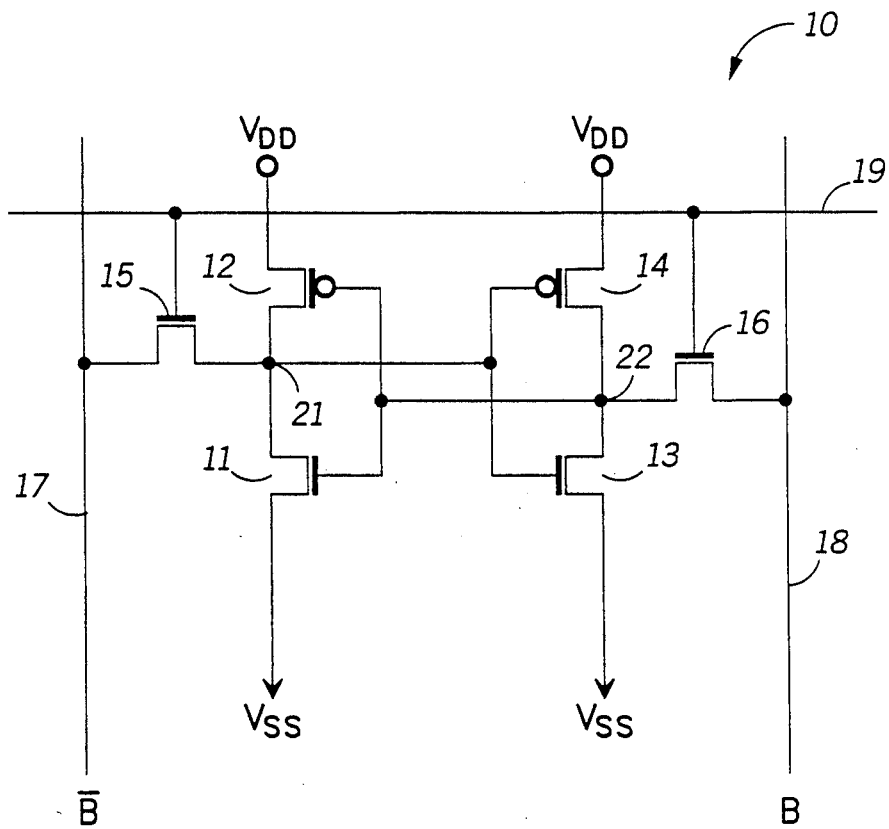
FIG. 1 is a circuit diagram of a conventional CMOS static RAM cell which is known in the art.

Shown in FIG. 1 is a conventional circuit diagram of a static RAM cell 10 comprised of an N channel transistor 11, a P channel transistor 12, an N channel transistor 13, a P channel transistor 14, an N channel transistor 15, and an N channel transistor 16. Transistors 15 and 16 operate as pass transistors utilizing the bilateral nature of MOS transistors by which drain and source functions of first and second current electrodes are interchangeable. Bit lines 17 and 18 in FIG. 1 are for providing a data bit signal in true and complementary form to or from cell 10. A word line 19 shown in FIG. 1 is for carrying a signal which will enable cell 10 for receiving or outputting the data bit signal.

Transistor 11 has a source connected to a negative power supply terminal $V_{SS}$ which is typically ground, a drain connected to a node 21, and a gate connected to a node 22. Transistor 12 has a source connected to a positive power supply terminal $V_{DD}$ which is typically 5 volts, a drain connected to node 21, and a gate connected to node 22. Transistor 13 has a source connected to $V_{SS}$, a drain connected to node 22, and a gate connected to node 21. Transistor 14 has a source connected to $V_{DD}$, a drain connected to node 22, and a gate connected to node 21. Transistor 15 has a first current electrode connected to node 21, a second current electrode connected to bit line 17, and a control electrode connected to word line 19. Transistor 16 has a first current electrode connected to node 22, a second current electrode connected to bit line 18, and a control electrode connected to word line 19.

Figure 2A:
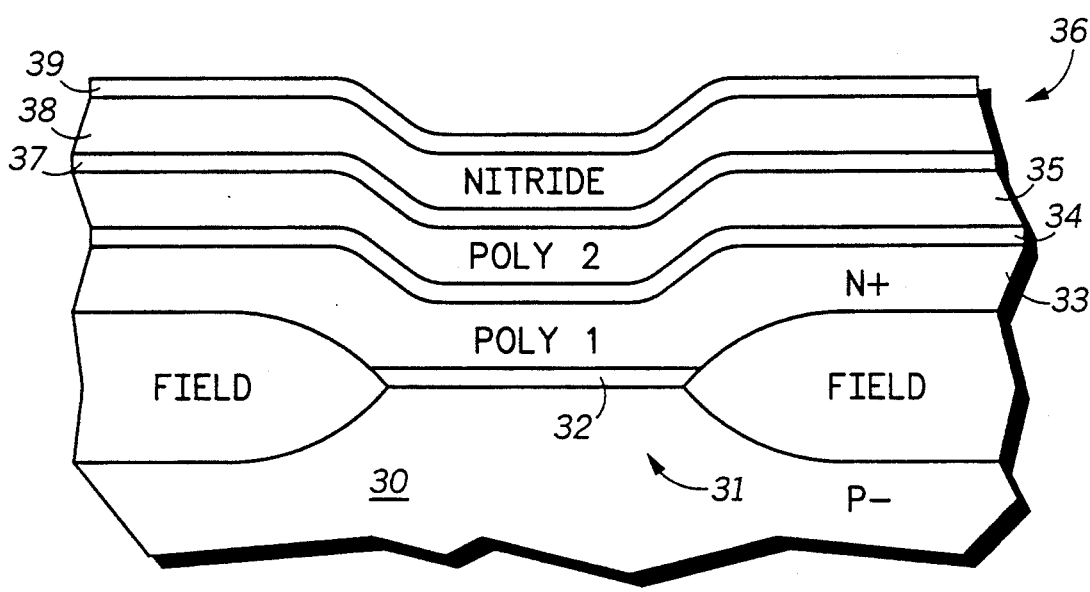
FIGS. 2A–2K are cross-sections of a polysilicon transistor taken at various stages in processing showing a novel device structure.

Shown in FIGS. 2A–2K are cross-sections of a P channel transistor and an N channel transistor which could be used, for example, as P channel transistor 12 or 14 and N channel transistor 11 or 13, respectively. The N channel transistor is formed in a P-silicon substrate 30 as shown in FIGS. 2A–2Kl. Active regions surrounded by field oxide are formed. Active region 31 is shown in FIGS. 2A–2K as one such active region. Formed over active region 31 is a gate oxide 32. Over gate oxide 32 is formed a layer of first polysilicon 33. First polysilicon layer 33 is doped to N+ to have a relatively high conductivity. Over first polysilicon layer 33 is formed an interlayer oxide 34. Over interlayer oxide 34 is formed a layer of second polysilicon 35. Over a second polysilicon layer 35 is formed an oxide-nitride-oxide (ONO) layer comprised of an oxide layer 37, a nitride layer 38, and an oxide layer 39. The resulting structure of these steps is shown in FIG. 2A. Gate oxide 32 acts as an insulator to insulate substrate 30 from first polysilicon layer 33. Interlayer oxide 34 acts as an insulator to insulate first polysilicon layer 33 from second polysilicon layer 35.

Figure 2B:
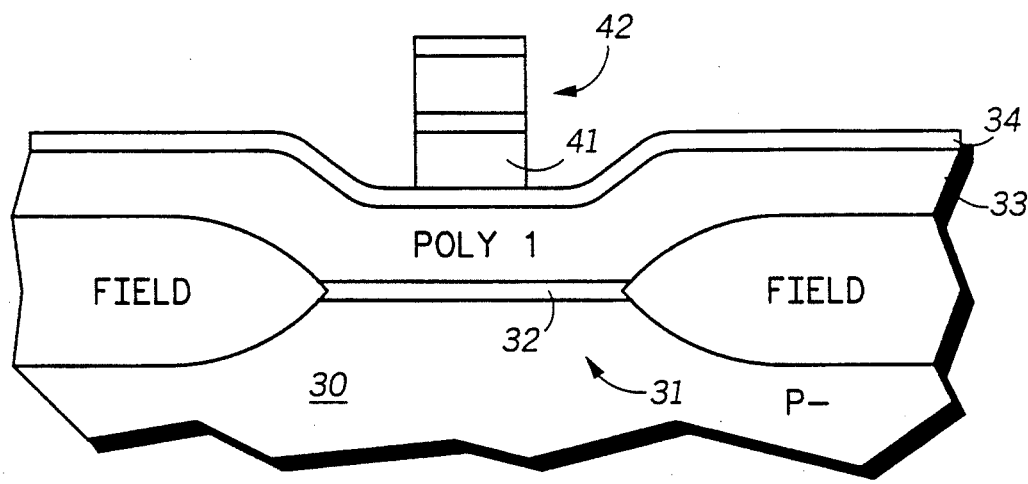
Figure 2C:
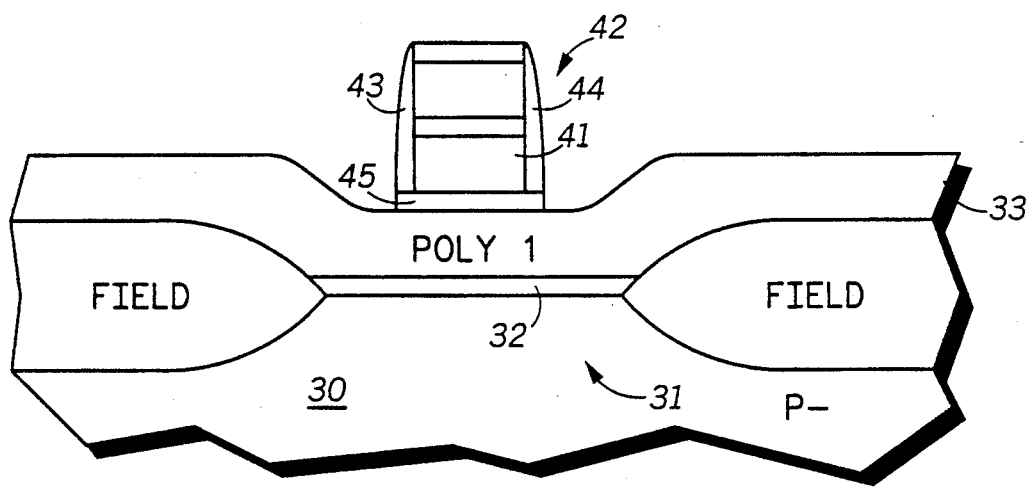
Figure 2D:
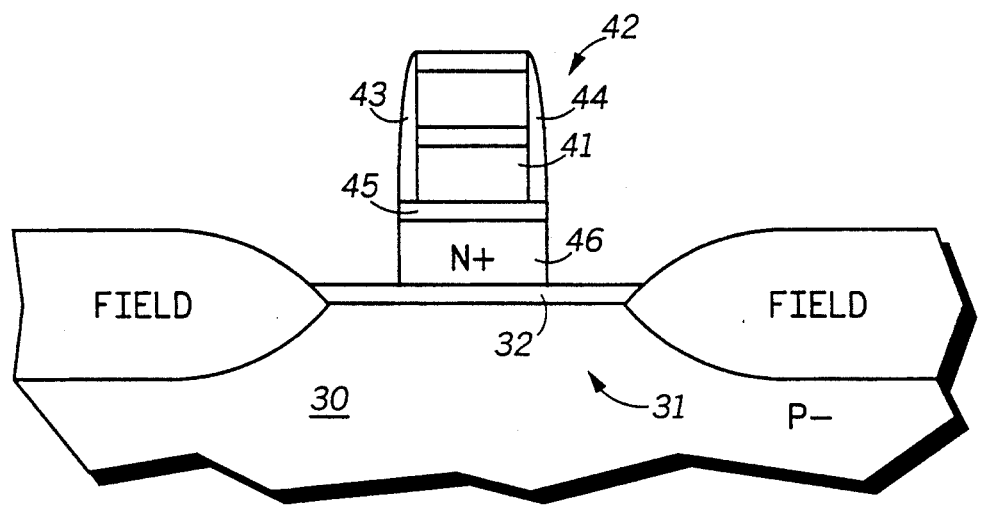

ONO layer 36 and second polysilicon layer 35 are selectively etched to form an unetched portion 41 of second polysilicon and an unetched portion 42 of ONO. The resulting structure of this selective etching is shown in FIG. 2B. Sidewall spacers 43 and 44 are formed on sides of portions 41 and 42. Interlayer oxide 34 is etched using portions 41 and 42, and sidewall spacers 43 and 44 as a mask leaving and interlayer oxide portion 45. The resulting structure after this step is shown in FIG. 2C. First polysilicon layer 33 is then selectively etched using the structure comprised of portions 41, 42, and 45 and sidewall spacers 43 and 44 as a mask leaving a first polysilicon portion 46. The resulting structure is shown in FIG. 2D. In addition to using the unetched second polysilicon and associated structure as a mask, an additional mask can be added so that other portions of first polysilicon are left unetched in addition to those under unetched second polysilicon. The portions of first polysilicon which are left unetched but are not under second polysilicon can be used for making gate connections from other circuit elements. The additional mask can be added to the structure of FIG. 2B before the selective removal of interlayer oxide 34.

Figure 2E:
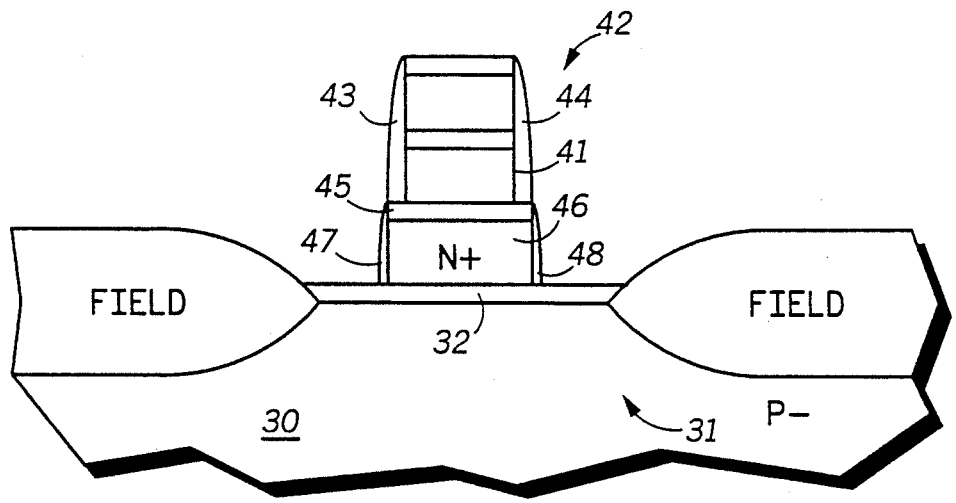
Figure 2F:
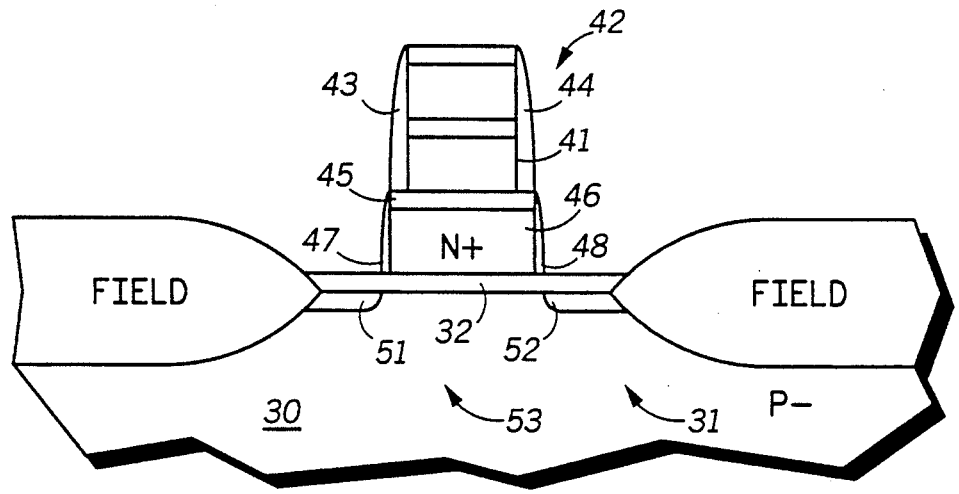

Oxide portions 47 and 48 are formed on sidewalls of first polysilicon portion 46 leaving the structure shown in FIG. 2E. Lightly doped N-source/drain regions are then implanted to form regions 51 and 52 leaving a channel region 53 therebetween. Sidewall spacers 43 and 44 protect second polysilicon portion 41 from receiving the N-type dopant which is used to implant the source/drain regions. Of course ONO portion 42 also protects second polysilicon portion 41 from this N-type implant. The resulting structure after forming lightly-doped source/drain regions 51 and 52 is shown in FIG. 2F.

Figure 2G:
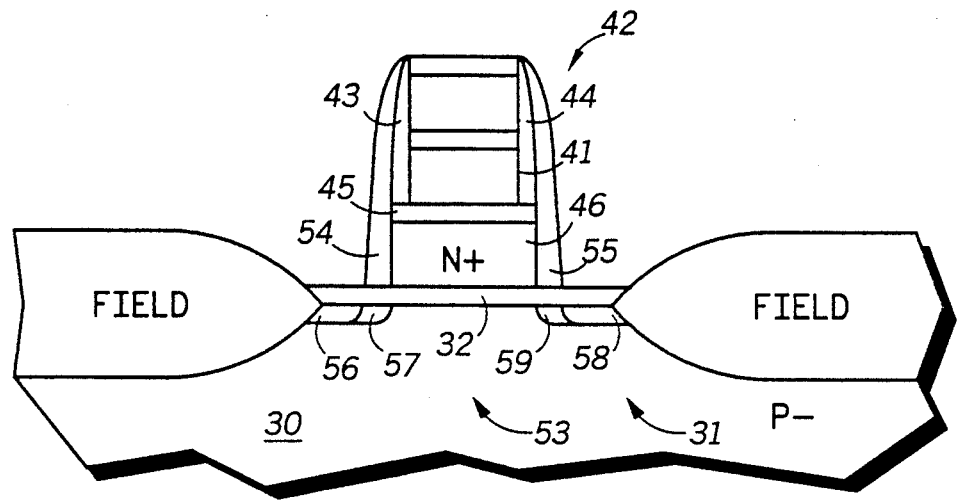

As is conventional for forming lightly-doped drain regions, sidewall spacers are formed to provide the masking for implanting into portions of the source/drain regions which are offset from the channel to increase the conductivity of the source/drain regions which reduces interconnect resistivity. Sidewall spacers 54 and 55 are shown in FIG. 2G. After formation of sidewall spaces 54 and 55, an N-type inplant is performed which results in lightly-doped regions 51 and 52 of FIG. 2F each being converted to regions with an N-portion and an N+ portion. The resulting structure is shown in FIG. 2G which depicts the conversion of lightly-doped region 51 to an N+ region 56 and a remaining N− region 57 adjoining channel 53 and the conversion of lightly-doped region 52 to an N+ region 58 and a remaining N− region 59 adjoining channel 53. There are well known advantages of the lightly-doped drain structure but which do come at the expense of increased process complexity. Instead of implementing a lightly-doped drain structure, regions 51 could be doped to N+ instead of being lightly doped. In which case, sidewall spacers 54 and 55 of FIG. 2G would not need to be formed. In either case, there is developed a self-aligned structure over the channel, of first polysilicon over the gate insulator in the active region, an interlayer insulator over the first polysilicon, and second polysilicon over the interlayer insulator to form a mask for the formation of the source and drain in the substrate. The second layer of polysilicon is protected from being doped during the formation of the source and drain in the substrate. This structure has an inherent advantage which allows the formation of the interlayer insulator to occur before the formation of the source and drain. This is a significant advantage because the formation of the interlayer insulator can then be optimized without concern of such optimizing having a deleterious affect on the source and drain. If, for example, oxide is the intended interlayer insulator, the oxide can be formed at various temperatures. Integrity of such oxide, however, is substantially better if the temperature at which it is formed is higher than that at which sources and drains will significantly migrate both downward and into the channel. Both of these consequences are undesirable. There has thus been a tradeoff between the integrity of the interlayer oxide and the depth of the sources and drains. The solution has been to increase the thickness of the interlayer oxide to the point that the needed integrity is reached. This is, however, not desirable for the case in which the interlayer insulator is to act as a gate insulator when the source and drain of a transistor are to be formed in the second polysilicon layer. Another advantage is that the second layer of polysilicon need not have pass over sharp corners of the first polysilicon layer. Typically, in the past, second polysilicon had to overlap the first polysilicon at an etched corner of polysilicon. The present method allows implementation of a polysilicon transistor without requiring the second layer of polysilicon to overlap a sharp corner of etched first polysilicon.

Figure 2H:
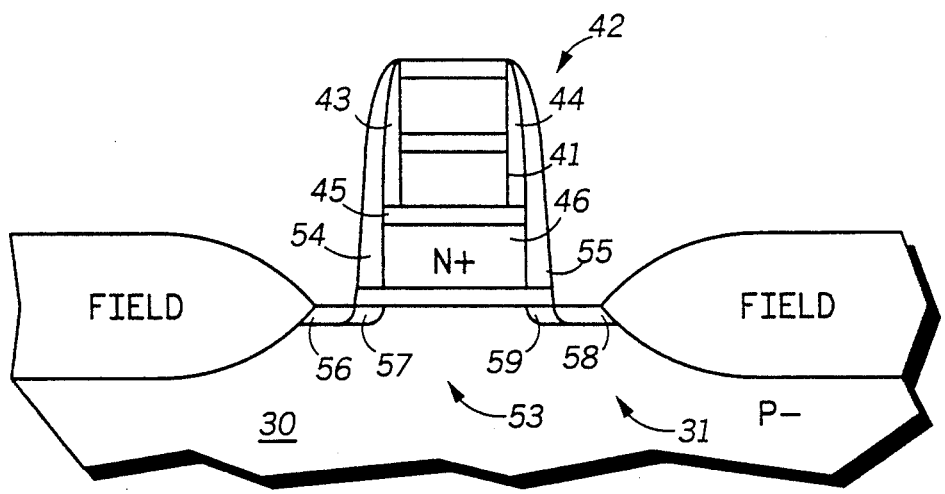
Figure 2I:
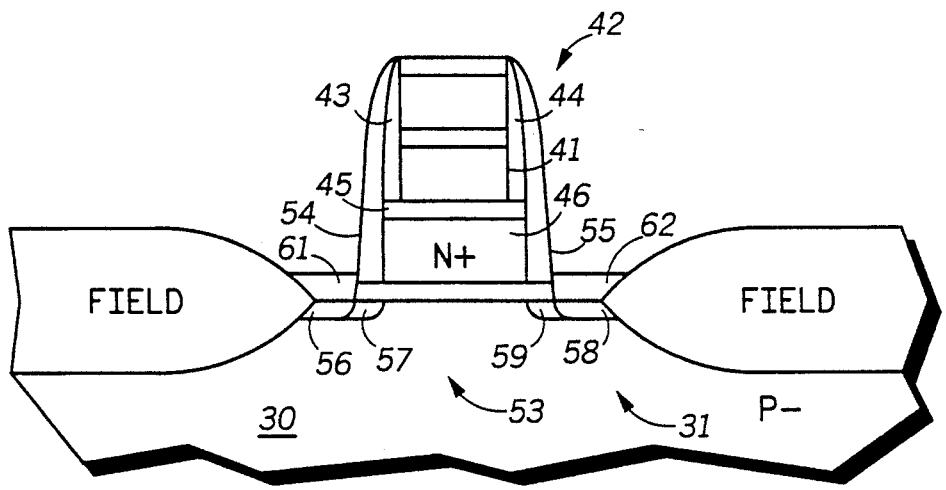
Figure 2J:
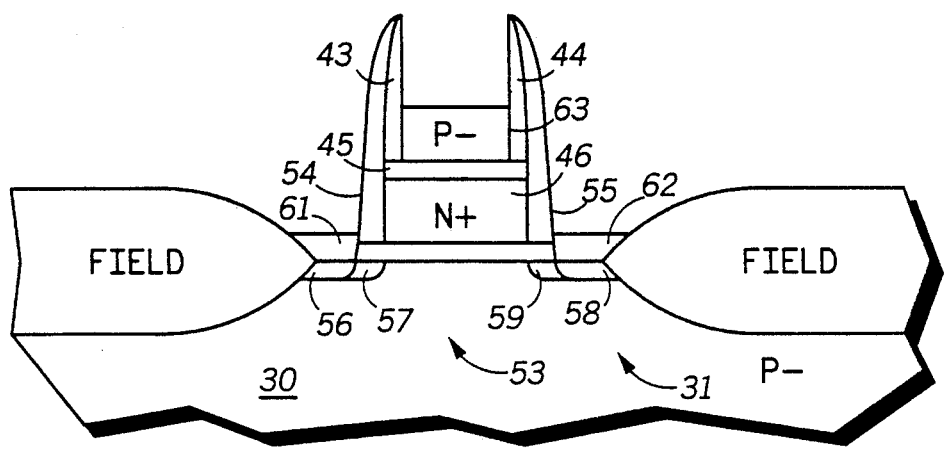

To complete formation of the P channel transistor, additional process steps are performed. One step, although not essential to forming the P channel transistors, is to cover the highly doped portions of the source and drain regions with titanium silicide. The titanium silicide can also be formed on the portions of first polysilicon left after etching which are not covered by second polysilicon. As shown in FIG. 2H, the insulator over regions 56 and 58 is removed and, as shown in FIG. 2I, portions 61 and 62 of titanium silicide are formed over regions 56 and 58, respectively. This formation of titanium silicide over sources and drains is known to reduce resistance and improve interconnecting of elements. The structure of FIG. 2J shows a P− region 63 formed in second polysilicon portion 41 which could be either the source or drain of the P channel transistor formed in second polysilicon. The source/drain region 63 shown in FIG. 2J is selected for doping to P-type by removing the ONO over the selected portion. The location of the channel is selected by not removing the portion of the ONO which overlies the intended channel location. The structure of FIG. 2I, particularly second polysilicon 41, shows how the channel of the P channel transistor looks in cross-section after the formation of the source and drain in second polysilicon according to the method of the preferred embodiment of the invention. The subsequent P-type implant is prevented from reaching the intended channel portion by the remaining ONO while the exposed portions of second polysilicon are P-doped. The N-type source/drains are protected from the P-type implant by the titanium silicide. As shown in FIG. 2J, titanium silicide regions 61 and 62 prevent the P implant from reaching N+ regions 56 and 58. Other techniques which may be used to protect the N+ source/drain regions from the P implant include photoresist application and etchback and the use of spin-on glass. There are portions of first polysilicon, not shown, which are exposed to the P-type doping but first polysilicon is heavily doped to N+ so that the exposed portions of first polysilicon remain N+. The exposed portions of first polysilicon are simply for making contact to the gates formed in first polysilicon. The effect of the relatively light P-type doping is thus insignificant. Additionally, titanium silidice is also applied to the exposed portions of first polysilicon which helps block the P implant.

Figure 2K:
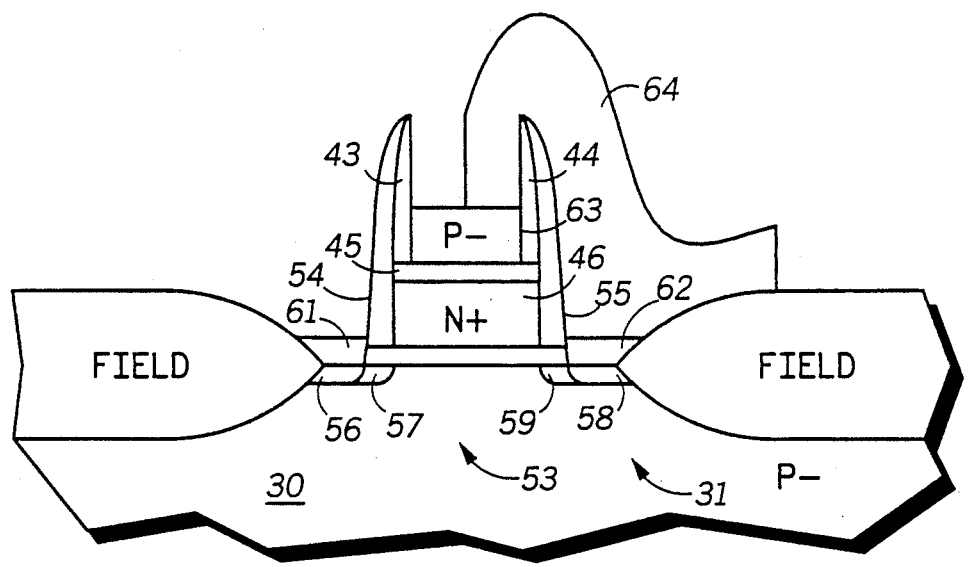

The drain of the P channel transistor must also be able to be connected to the drain of the N channel transistor as shown as nodes 21 and 22 in FIG. 1. This is achieved with titanium nitride which can be used effectively for this purpose of connecting a P-type region to an N-type region without forming a PN junction. Shown in FIG. 2K is a portion 64 of titanium nitride which connects drain region 63 to drain region 58 via titanium silicide portion 62. As shown in FIGS. 2I and 2J, the source/drain region 63 and the channel portion of second polysilicon portion 41 are both over active region 31. This is not necessary to implement the method of the preferred embodiment. The first polysilicon layer will extend beyond the active region in which the N channel transistor is formed so that one or more of, or portions of, the source, drain, and channel of the P channel transistor can be formed over field oxide or a combination of field oxide and active region. Similarly, the titanium nitride used for making the connection between drains of the P and N channel transistors can extend over field oxide as well in order to make the desired connection. The method disclosed allows for the formation of the source and drain of the transistor formed in the substrate to be formed after the the formation of the interlayer oxide. The preferred embodiment of the invention includes a provision for a lightly-doped drain approach and sidewall spacers to protect the second layer of polysilicon from being N-doped. Another approach that could be used to protect second polysilicon from the N-type implant is to undercut the second polysilicon during the etching of the second polysilicon so that the ONO would overhang the unetched second polysilicon. Yet another approach could be to oxidize second polysilicon after the etch of second polysilicon so to grow oxide at the polysilicon side and move the polysilicon boundary under the ONO. Furthermore, these approaches can be used in combination.

To optimize the polysilicon transistor, the channel region of the polysilicon transistor could be lightly N-type, P-type, or undoped. The subsequent P implant dose to form the source and drain would take into account that second polysilicon was already lightly N-type or P-type or undoped.

Figure 3:
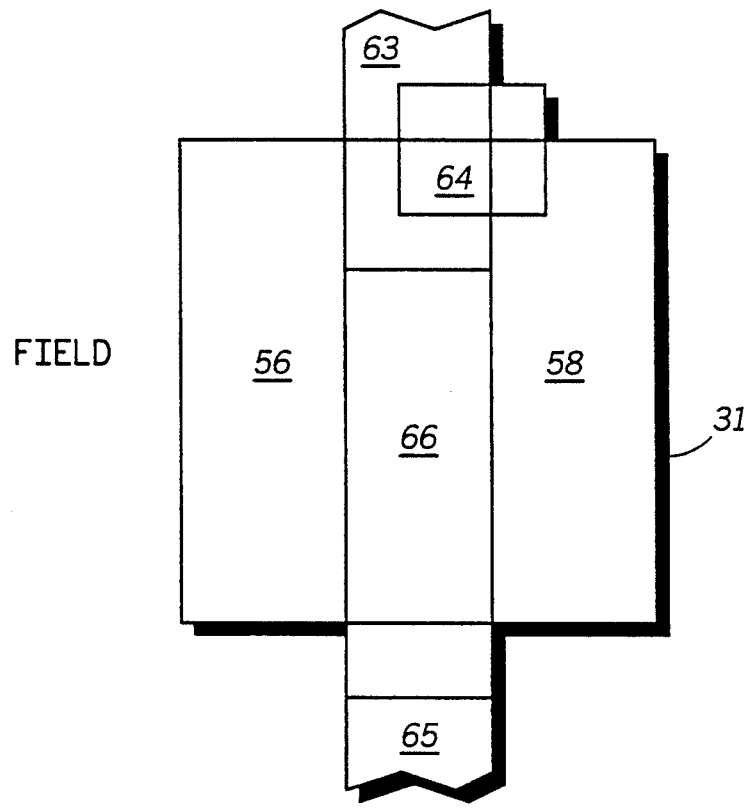
FIG. 3 shows a simplified layout of a polysilicon transistor made according to the method of the preferred embodiment.

Shown in FIG. 3 is a simplified layout of an N channel transistor an a P channel transistor which could be made according to the method of the preferred embodiment. Active region 31 is surrounded by field oxide. The second polysilicon layer of the self-aligned strip is divided into a channel 66 which is the portion of second polysilicon portion 41 over which ONO was not removed, drain 63, and a source 65 of the P channel transistor. In active region 31 are shown regions 56 and 58 for contacting the source and drain of the N channel transistor. Titanium nitride portion 64 is shown contacting drain 63 of the P channel transistor and region 58 of the N channel transistor in order to make the drain-to-drain contact of the N and P channel transistors. The self-aligned strip is shown crossing over active region 31 so as to leave at least two portions of active region 31 uncovered so that the source and drain of the N channel transistor can be formed in active region 31 after the formation of the self-aligned strip. As is apparent from FIG. 3, the source, drain, and channel locations of the polysilicon transistor can be either over field or active region or both. The source and drains of the polysilicon transistor could be formed before the substrate source and drain or even before first polysilicon is etched. The source and drain in second polysilicon could also be formed, via a mask, before second polysilicon is etched. Of course the source and drain would be located in the unetched portion of second polysilicon whether the source and drain are doped before or after the second polysilicon is etched. Another possiblility is for second polysilicon to not have a separately doped source and drain but that the entire second polysilicon could be P−. The formation of source and drain in the polysilicon transistor would be by making contact at ends of the particular polysilicon strip. In a similar fashion, the formation of source and drain in the substrate could be achieved using a Schottky barrier diode approach.

Figure 4A:
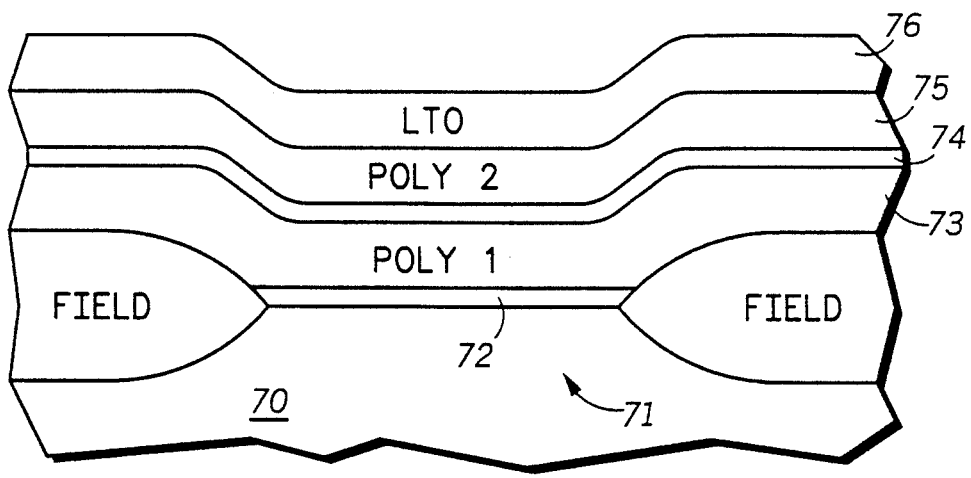
FIGS. 4A–4K are cross-sections of a device structure according to an alternative embodiment of the invention.

In an alternative to the approach described in FIGS. 2A-2K, an approach is shown in FIGS. 4A-4K which has an advantage with respect to making connection between a portion of a second polysilicon layer and a doped region in the substrate. Shown in FIG. 4A is a substrate 70 with an active region 71. Over active region 71 is formed a gate oxide 72. Over gate oxide 72 is formed a first polysilicon layer 73. Over first polysilicon layer 73 is formed an interlayer dielectric 74 of oxide. Over interlayer dielectric 74 is formed a second polysilicon layer 75. Over second polysilicon layer 75 is formed a low-temperature-oxide (LTO) layer 76. The differences between this structure of FIG. 4A and that of FIG. 2A is that LTO is used instead of ONO and the second polysilicon layer is thinner. A P channel transistor formed in second polysilicon has less leakage if it is thinner. For the case where a resistive load is formed in a second polysilicon layer, the resistor has higher resistance if it is thinner. Thus, there are good reasons for a second polysilicon layer to be made relative thin.

Figure 4B:
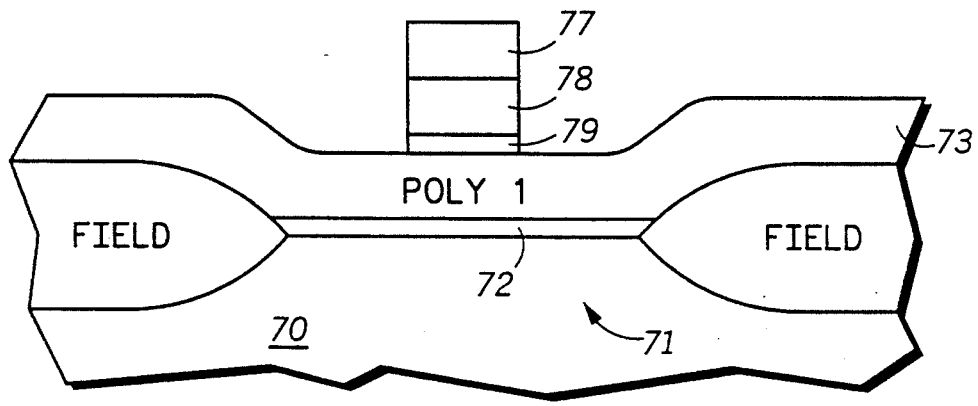
Figure 4C:
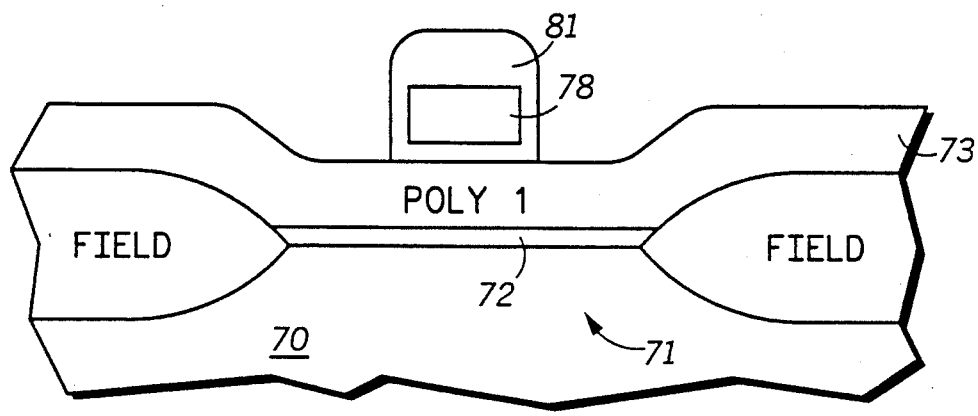
Figure 4D:
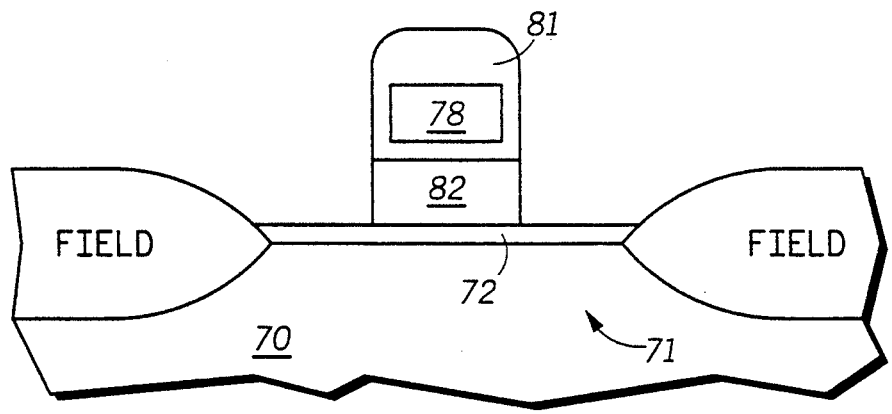

A selective etch of LTO layer 76, second polysilicon layer 75, and interlayer dielectric 74 is performed to leave unetched portions 77, 78 and 79 of LTO layer 76, second polysilicon layer 75, and interlayer dielectric 74, respectively. This is shown in FIG. 4B. Unetched portion 78 of second polysilicon layer 74 is then surrounded by oxide 81. Oxide 81 comprises unetched portion 77 of LTO layer 76 and unetched portion 79 of interlayer dielectric 74. Oxide 81 is further comprised of oxide formed on the sides of unetched portion 78. Oxide 81 can be realized by depositing LTO and performing an anisotropic etch such as a reactive ion etch (RIE) or by growing oxide. The sides of oxide 81 are desirably about 500 Angstroms thick. Oxide 81 is then used as a mask for etching first polysilicon layer 73 to leave an unetched portion 82 of first polysilicon layer 73 as shown in FIG. 4D. A light N− implant is then performed to form N− regions 83 and 84.

Figure 4E:
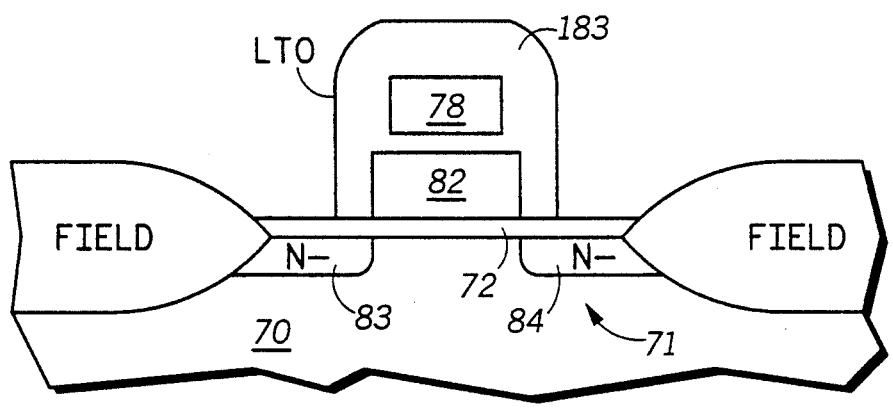

After that, another sidewall spacer process is performed to provide an oxide 183 on the sides of unetched portion 82 of first polysilicon layer 73. Oxide 183 is thus over and on the sides of unetched portion 78, on the sides of unetched portion 82, and between unetched portions 78 and 82. Gate oxide 72 not covered by unetched portion 82 can be repaired or modified as deemed necessary following etches and implants. It is common to etch away and regrow oxide over a substrate after an implant through that oxide or an etch that stops on that oxide. The result of the N− implant and oxide 183 formation is shown in FIG. 4E. Oxide 183 desirably extends about 1500 Angstroms from the sides of unetched portion 82.

Figure 4F:
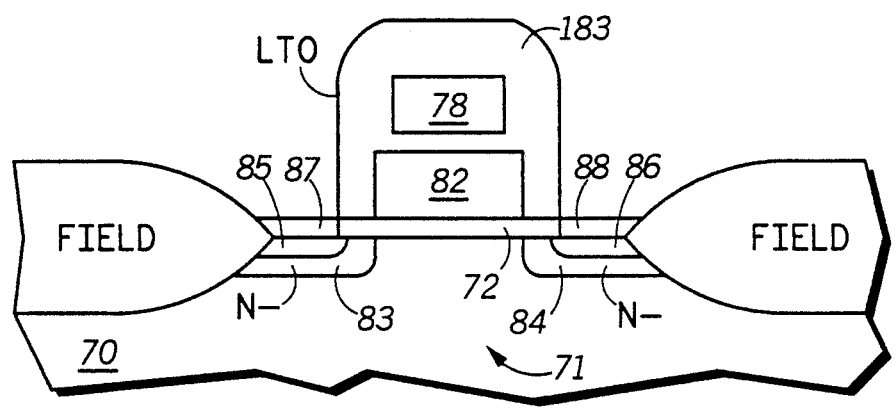

An N+ implant is performed using oxide 83 as a mask. This forms N+ regions 85 and 86 in N+ regions 83 and 84, respectively. Oxide is the removed over active region 71 not covered by oxide 183. Thin layers 87 and 88 of titanium silicide are then formed where this oxide was removed. There is then titanium silicide in contact with N+ regions 85 and 86. The result of this implant, oxide removal, and titanium silicide formation is shown in FIG. 4F.

Figure 4G:
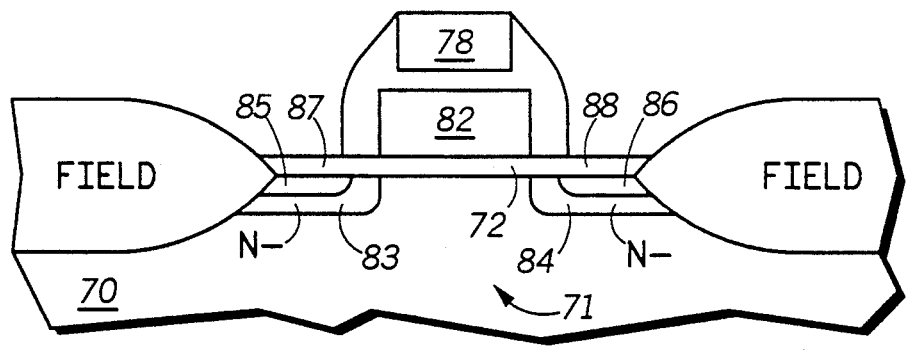
Figure 4H:
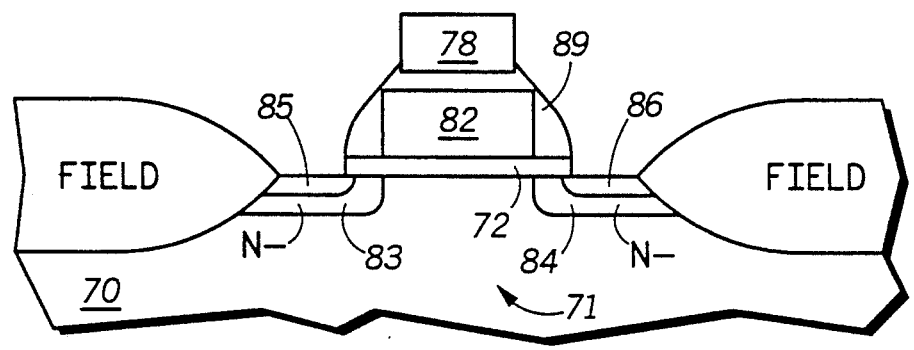
Figure 4I:
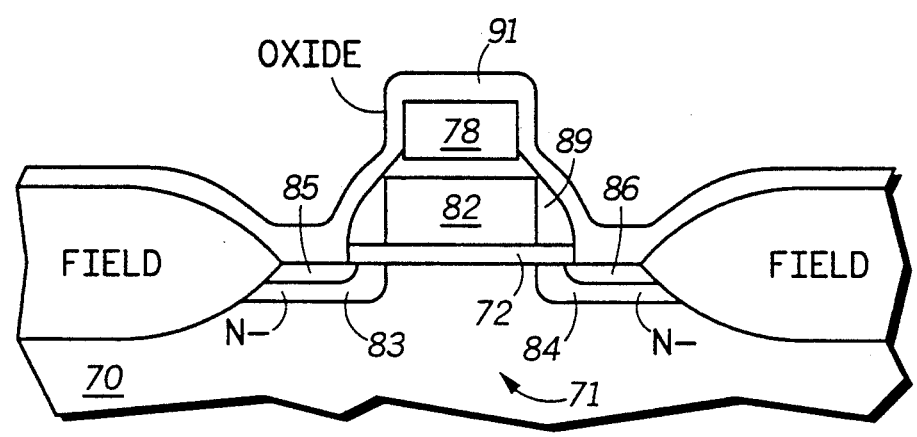

An objective at this point is to form a contact between unetched portion 78 and N+ region 86 via titanium silicide layer 88. An oxide etch is performed to remove the portion of oxide layer 183 which is above unetched portion 78 to expose portion 78. The desired result is shown in FIG. 4G. Of course there are many locations on a particular integrated circuit which have portions of the second polysilicon layer which must be exposed. In order to ensure that all locations where portions of the second polysilicon layer are to be exposed are in fact exposed, many of the locations will be over-etched. The result of this over-etch is shown in FIG. 4H. The etching of oxide 183 results in an oxide 89 which not only exposes unetched portion 78 but also a corner of unetched portion 82. Even if this corner is not exposed it may be sufficiently close to being exposed present a leakage path or a voltage breakdown problem. This could also be reliability problem.

Figure 4J:
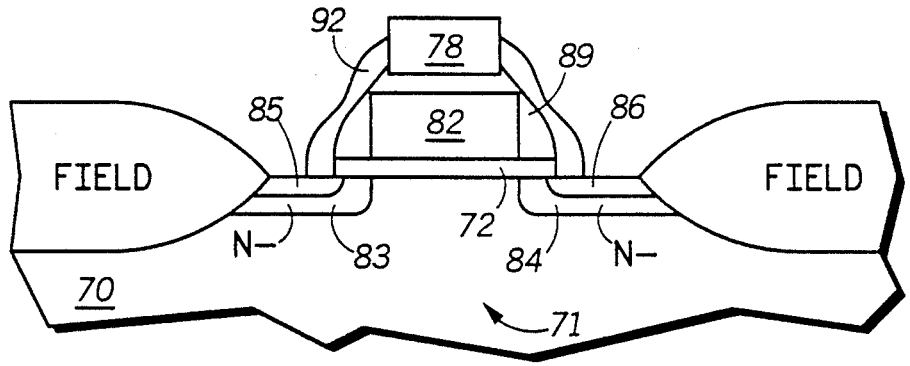
Figure 4K:
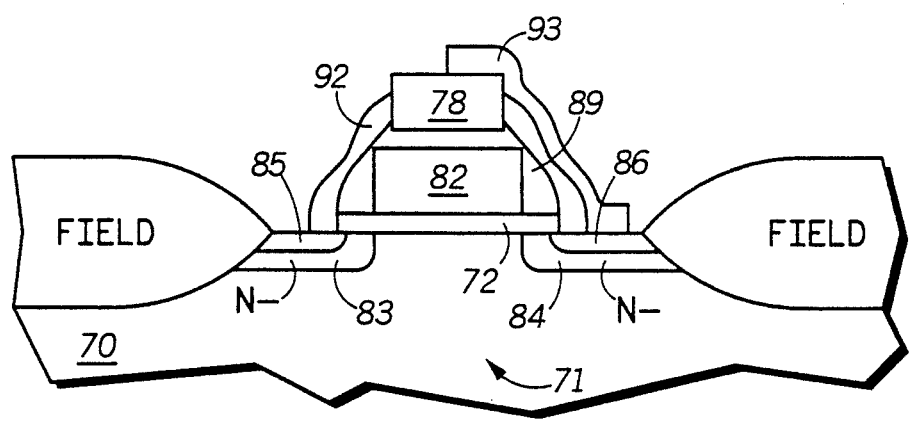

In order to prevent the corner from being a problem another sidewall spacer is formed. A conformal LTO layer 91 is formed to overlie active region 71. Because all of the second polysilicon that is to be contacted is certain to be exposed, the thickness of LTO layer 91 over the second polysilicon areas to be contacted is certain to be the same for all locations and need not be too thick, the subsequent etch of oxide 91 can be certain to expose all of the locations without requiring a large amount of over-etch. After the anisotropic etch, unetched portion 78 is exposed and a second sidewall spacer 92 left from LTO layer 91 protects the corner of unetched portion 82 from being exposed or even close to being exposed. This is shown in FIG. 4J. A titanium nitride layer is then formed to contact N+ region 86 with unetched portion 78. The additional unetched portion 78. The additional sidewall spacer 92 thus alleviates the problem of portions of the first polysilicon layer tending to short to contacts between the second polysilicon and the substrate.

Figure 5A:
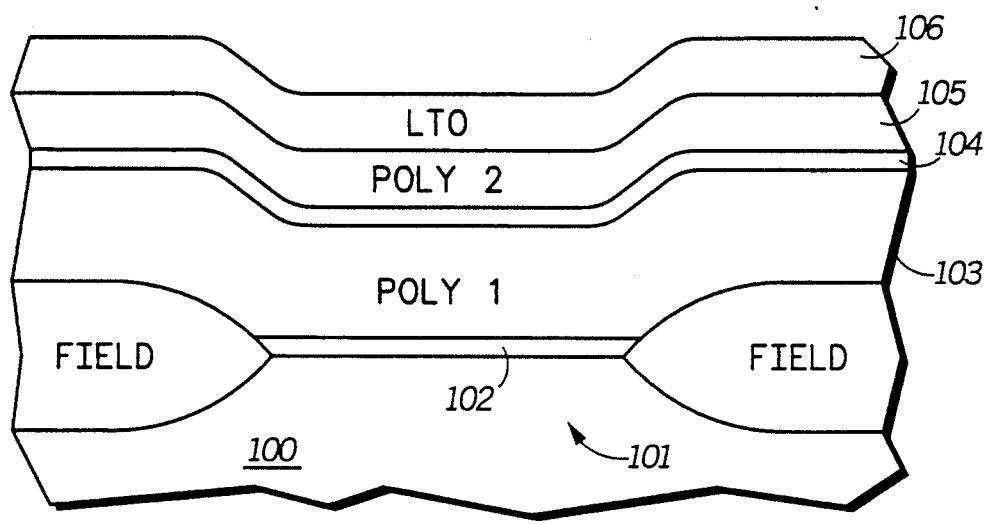
Figure 5B:
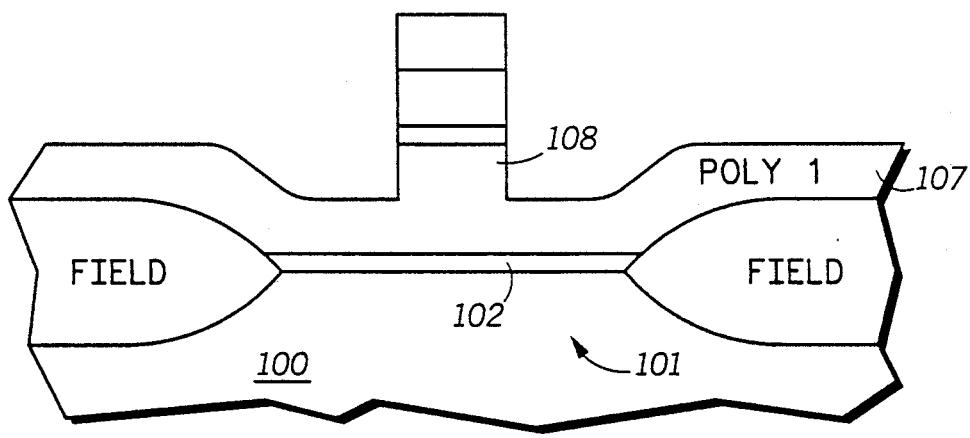
Figure 5C:
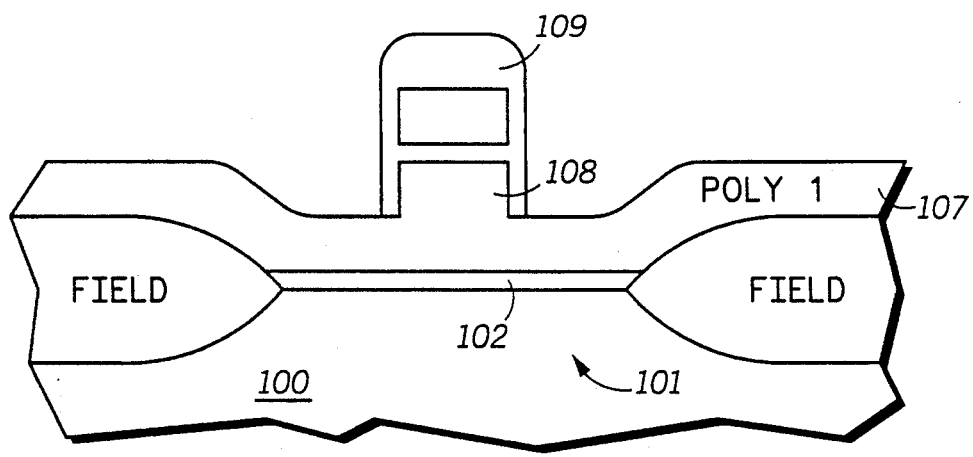

Another approach similar to that shown in FIGS. 4A-4K is shown in FIGS. 5A-5K. The starting point is the same as shown in FIG. 5A in which there is a substrate 100 with an active region 71. Over active region 71 is formed a gate oxide 102. Over gate oxide 102 is formed a first polysilicon layer 103. Over first polysilicon layer 103 is formed an interlayer dielectric 104 of oxide. Over interlayer dielectric 104 is formed a second polysilicon layer 105. Over second polysilicon layer 105 is formed a low-temperature-oxide (LTO) layer 106. Layers 104, 105, and 106 are etched in the same manner as layers 74, 75, and 76 of FIG. 4A. Polysilicon layer 103 is partially etched with the same mask as that used for etching layers 104, 105, and 106, whereas polysilicon layer 73 is not etched with the same mask as that used for etching layers 74, 75, and 76. First polysilicon layer 103 is partially etched to result in a polysilicon layer 107 with a neck portion 108. The processing continues the same thereafter as for FIGS. 4C-4K.

Figure 5D:
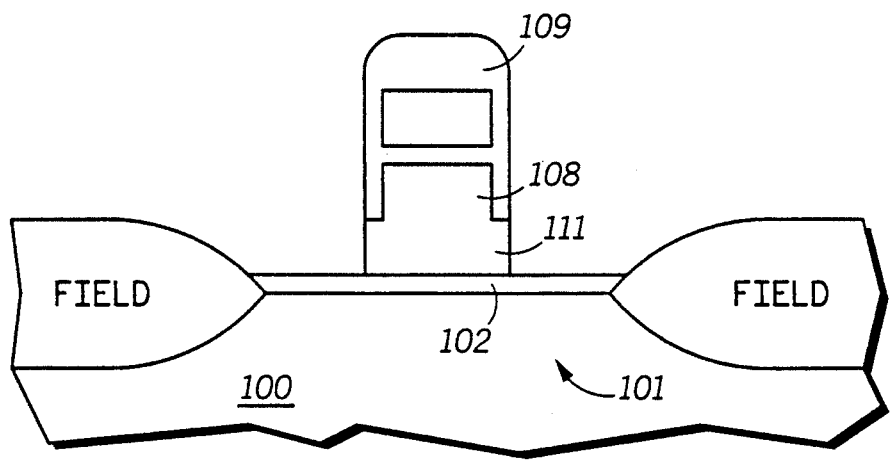
Figure 5E:
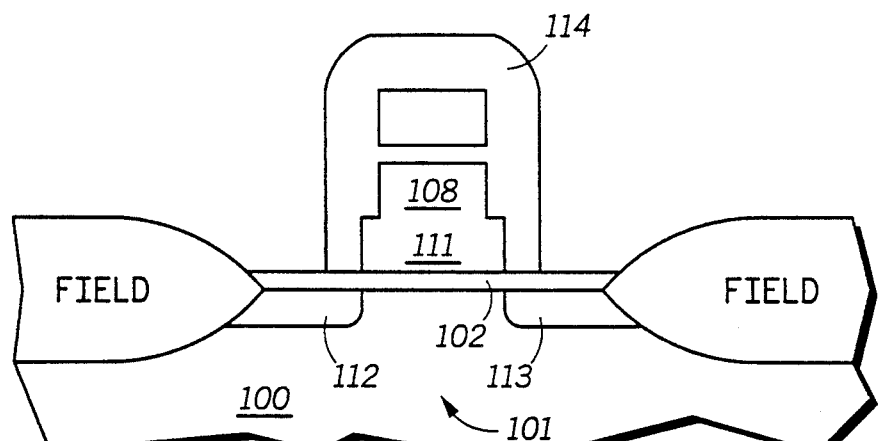
Figure 5F:
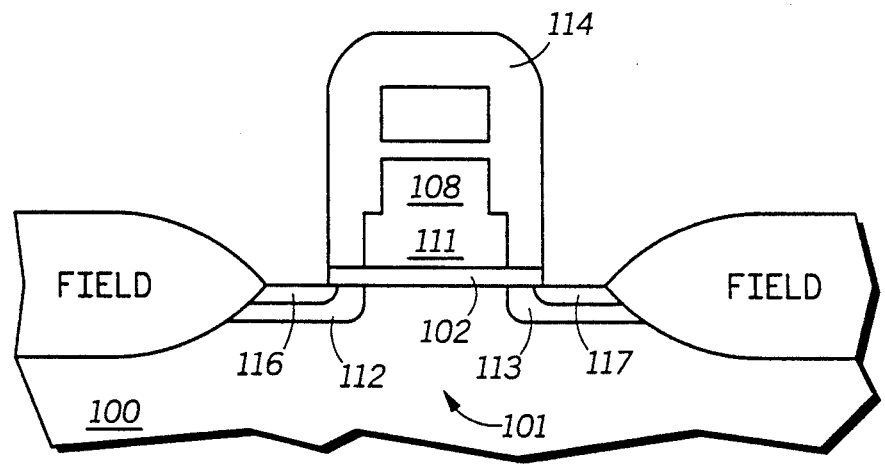
Figure 5G:
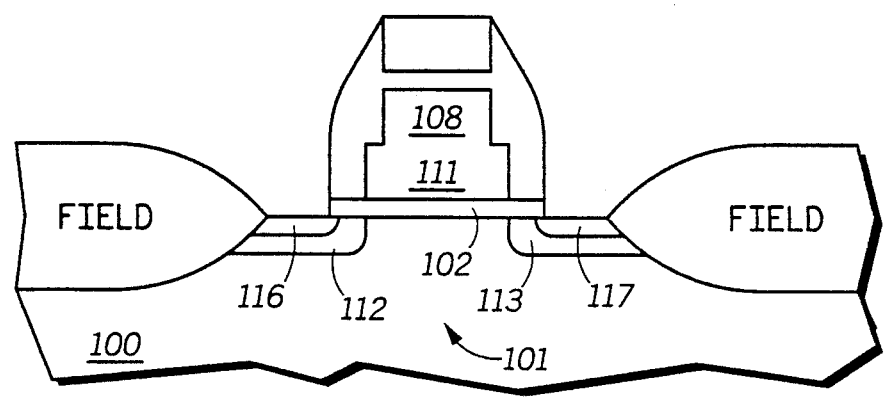
Figure 5H:
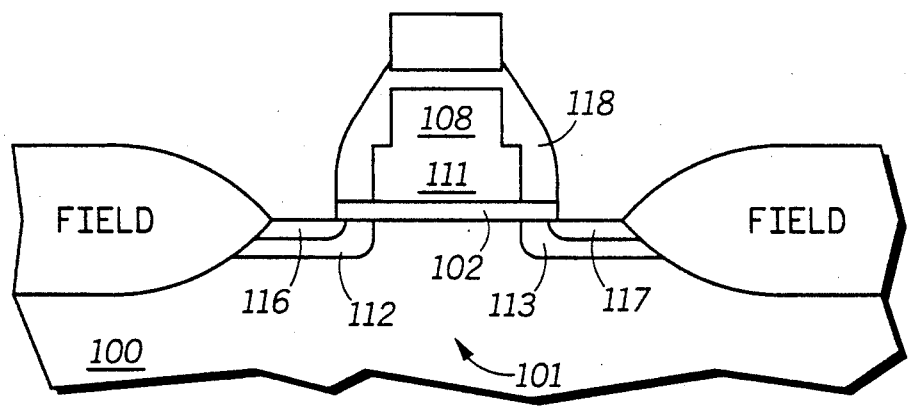
Figure 5I:
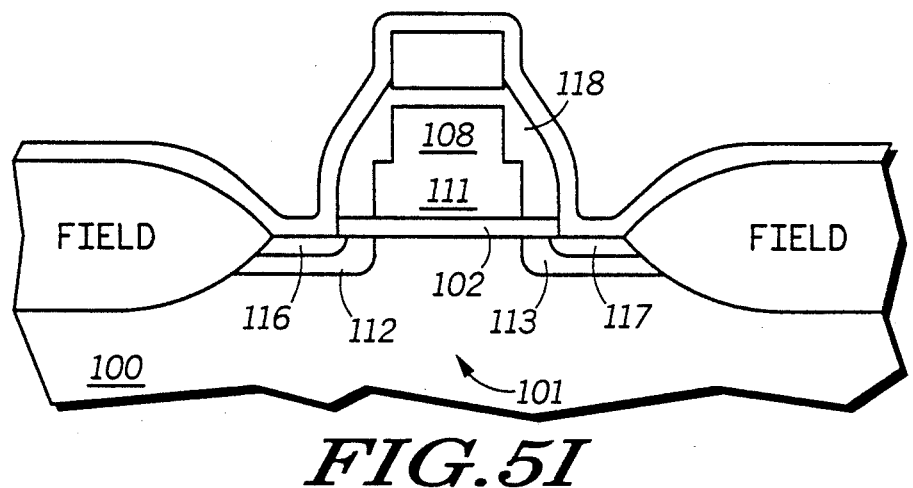
Figure 5J:
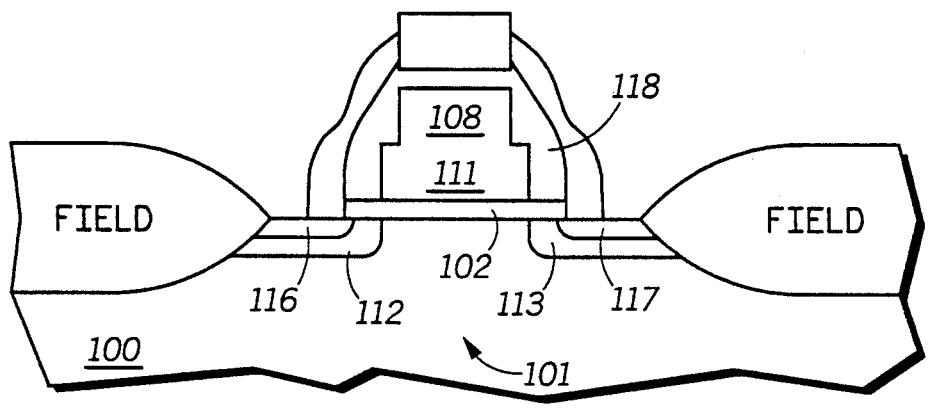
Figure 5K:
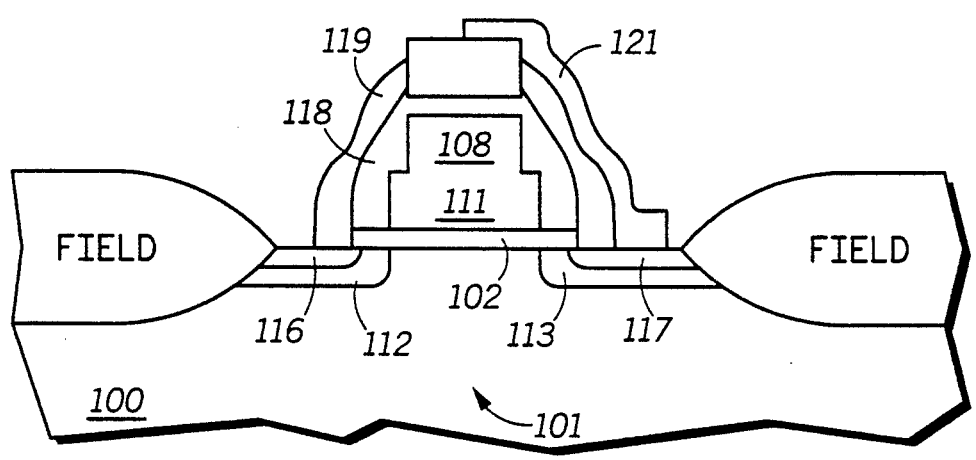

An oxide 109 is formed to establish a mask for etching polysilicon layer 107 to form a polysilicon portion 111 with neck portion 108 being retained as shown in FIG. 5D. Lightly-doped regions 112 and 113 and an oxide 114 are formed as shown in FIG. 5E. Heavily-doped regions 116 and 117 are formed as shown in FIG. 5F. Oxide 114 is etched to expose the unetched portion of second polysilicon layer 105 and further etched to ensure that all portions of the second polysilicon layer that are intended to be exposed are in face exposed as shown in FIGS. 5G and 5H. The advantage of partially etching first polysilicon layer 103 to obtain polysilicon layer 107 with neck 108 is shown in FIG. 5H. A sidewall oxide 118 which is analogous to oxide 89 in FIG. 4H is spaced further from the corner of polysilicon layer 107 than oxide 89 is spaced from polysilicon portion 82 in FIG. 4H. There is thus more margin in avoiding having the subsequently formed drain to second polysilicon contact short to the first polysilicon layer for the case in which the first polysilicon layer is partially etched. A second sidewall spacer 119 is formed as shown in FIGS. 5I and 5J. A titanium nitride contact is formed to contact region 117 to second polysilicon. As control of the process increases, it may be possible to not have to use the second sidewall spacer. The second polysilicon to drain contact could thus be formed following the device structure of FIG. 5H.

While the invention has been described in a specific embodiment, it will be apparent to those skilled in the art that the disclosed invention may be modified in numerous ways and may assume many embodiments other than those specifically set out and described above. For example, alternative material may be used. Accordingly, it is intended by the appended claims to cover all modifications of the invention which fall within the true spirit and scope of the invention.

I claim:

1. A semiconductor device formed on an active region of a substrate, comprising:
   a first conductive strip over and insulated from the active region;
   a second conductive strip over and insulated from the first conductive strip;
   a first sidewall spacer adjacent to a side of the first conductive strip;
   a second sidewall spacer over all of the first sidewall spacer and having a portion adjacent to the second conductive strip;
   a region in the active region adjacent to the second sidewall spacer; and
   a contact between said region in the active region and the second conductive strip.

2. A semiconductor device formed on an active region of a semiconductor substrate, comprising:
   a first conductive strip over and insulated from the active region;
   a second conductive strip over and insulated from the first conductive strip, said first conductive strip having a neck portion protruding upward toward the second conductive strip and aligned with said second conductive strip;
   a first sidewall spacer adjacent to a side of the first conductive strip;
   a region in the active region adjacent to the first sidewall spacer; and
   a contact between said region in the active region and the second conductive strip.

3. A semiconductor device formed on an active region of a substrate, comprising:
   a first conductive strip over and insulated from the active regions;
   a second conductive strip over and insulated from the first conductive strip, said first conductive strip having a neck portion protruding upward toward the second conductive strip and aligned with said second conductive strip;
   a first sidewall spacer adjacent to a side of the first conductive strip;
   a second sidewall spacer over the first sidewall spacer and having a portion adjacent to the second conductive strip;
   a region in the active region adjacent to the second sidewall spacer; and
   a contact between said region in the active region and the second conductive strip.

* * * * *